United States Patent [19]

Creutz

[11] Patent Number: 4,646,130
[45] Date of Patent: Feb. 24, 1987

[54] SEMICONDUCTOR DEVICE FOR CURRENT RECTIFICATION

[75] Inventor: Helmut Creutz, Zirndorf, Fed. Rep. of Germany

[73] Assignee: Semikron Gesellschaft für Gleichrichterbau und Elektronik m.b.H., Nuremberg, Fed. Rep. of Germany

[21] Appl. No.: 587,574

[22] Filed: Mar. 8, 1984

[30] Foreign Application Priority Data

Mar. 11, 1983 [DE] Fed. Rep. of Germany ....... 3308661

[51] Int. Cl.[4] .................... H01L 23/36; H02G 13/08
[52] U.S. Cl. ................................. 357/79; 361/391; 174/52 FP
[58] Field of Search .............. 174/52 P; 357/79; 361/391

[56] References Cited

U.S. PATENT DOCUMENTS

| | | | |
|---|---|---|---|
| 3,597,524 | 8/1971 | Schreiner et al. | 357/79 |
| 4,150,394 | 4/1979 | Sugawa et al. | 357/79 |
| 4,302,767 | 11/1981 | Eisele | 357/79 |
| 4,426,659 | 1/1984 | de Bruyne et al. | 357/79 |

FOREIGN PATENT DOCUMENTS

| | | |
|---|---|---|
| 0009152 | 4/1980 | European Pat. Off. |
| 0048916 | 4/1982 | European Pat. Off. ............. 361/395 |
| 0088923 | 4/1983 | European Pat. Off. |
| 3006023 | 2/1980 | Fed. Rep. of Germany. |
| 2940571 | 4/1981 | Fed. Rep. of Germany ......... 357/79 |
| 2074373 | 10/1981 | United Kingdom. |

Primary Examiner—William L. Sikes
Assistant Examiner—Vangelis Economou
Attorney, Agent, or Firm—Horst M. Kasper

[57] ABSTRACT

A semiconductor element is provided as an electrically tested, economical, long time storable and simple individual element for easy assembly and universal application. A semiconductor disk and an insulating body annularly surrounding the semiconductor disk are used. The insulating body is furnished with a recess substantially adapted to the edge zone of the semiconductor disk and which is also formed in the regions adjacent to the recess for a concentric disposition of contacting components on the two sides of the semiconductor disk. The semiconductor disk is supported and embedded at its edge zone in the recess of the insulating body. In case of a semiconductor disk with a gate electrode the gate current conductor is led through the insulating body and is then formed as a spring body with a rotatable and curved end piece for pressure contacting the gate electrode.

21 Claims, 6 Drawing Figures

SEMICONDUCTOR DEVICE FOR CURRENT RECTIFICATION

DESCRIPTION

BACKGROUND OF THE INVENTION

1. Field of the Invention

The present invention relates to a semiconductor device mounted in a tubular section.

2. Brief Description of the Background of the Invention Including Prior Art

The individual elements of current rectifiers with high current loading are preferably disk-shaped semiconductor elements, which are called disk cells or press-packs and which are provided with contacts and disposed between cooling elements.

Known disk cells comprise a stack formed from a disk shaped semiconductor body in the following designated as semiconductor disk and adjacent contact disks, which stack is disposed in a casing of metallic covering plates and of an insulation ring attached sealingly between the cover plates. Such a construction involves large material and processing requirements. The sealed disposition of the stack in order to avoid damaging environmental influences on the electrical behavior renders necessary the undesirable binding of material by employing expensive individual parts for the casing and for the assembly during the storage of ready built disc cells. Finally, considerable losses arise, if such cost-intensive devices are thrown out based on impermissible changes in the characteristics after storage or if they have to be reprocessed.

Cheaper construction ways are known for substantially disk-shaped semiconductors, where the parts of the stack are covered and held together with a stocking tube with the exception of the contact surfaces.

According to other constructions based on the principle of the disk cells, a stack of semiconductor disk and of contact parts is placed in recesses of an insulating body, which forms a case together with current and/or heat conducting elements and intermediate sealing bodies. The known constructions are mechanically insufficiently stable, in particular at high operating or processing temperatures, and in addition they are not sufficiently stable for long term storage.

SUMMARY OF THE INVENTION

1. Purposes of the Invention

It is an object of the present invention to provide a semiconductor package with a construction, where an individual element is provided which is electrically tested, particularly economical, long term stable and which favors a simple assembly.

It is another object of the present invention to provide an individual element, which allows in a desired way the incorporation both into a conventional disk cell as well as into construction units with two or more semiconductor elements and which can also be completed to a separate device for different constructions, applications and uses.

It is a further object of the present invention to provide a semiconductor package which can be easily assembled and disassembled and where the semiconductor proper is adhesively supported.

These and other objects and advantages of the present invention will become evident from the description which follows.

2. Brief Description of the Invention

The present invention provides a semiconductor device which comprises an insulating body surrounding a semiconductor disk like a circle, a recess provided at the inner jacket face of the insulating body and closed into itself and substantially adapted to the edge zone of the semiconductor disk, where the semiconductor disk is at its edge zone supported and embedded in the recess of the insulating body and where the insulating body is formed at the sides of the recess such as to accept contacting element structure on the two sides of the semiconductor disk, and a gate electrode disposed at the semiconductor disk. A lead for the gate runs from the outside of the insulating body through the insulating body, and a rotary and curved end spring piece pressure contacts the gate electrode and is connected to the lead.

The invention provides the advantage that all components to contact the semiconductor disk are exchangeable as far as possible. Stable electrical properties are provided and assured independent of the contacting parts, the storage and the application. There are substantial savings in costs as compared with known constructions. The new device is not limited in its use, while it is based on a very simple assembly with contacting and cooling elements.

There is also provided a method for producing a semiconductor device which comprises fabricating a semiconductor disk, forming an at least two part outer plastic ring with an inner recess for supporting the semiconductor disk, embedding the semiconductor disk in the inner recess; attaching a gate electrode at one of the faces of the semiconductor disk, and feeding a lead connected to the gate electrode through the insulating body.

An adhesion material can be disposed in the recess before embedding the semiconductor disk. A spring element can be attached with rotary or curved end piece to the gate electrode and on its other end to the lead.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which are shown several of the various possible embodiments of the present invention.

All Figs. employ the same numerals for the same parts.

DESCRIPTION OF INVENTION AND PREFERRED EMBODIMENTS

Figure 1:
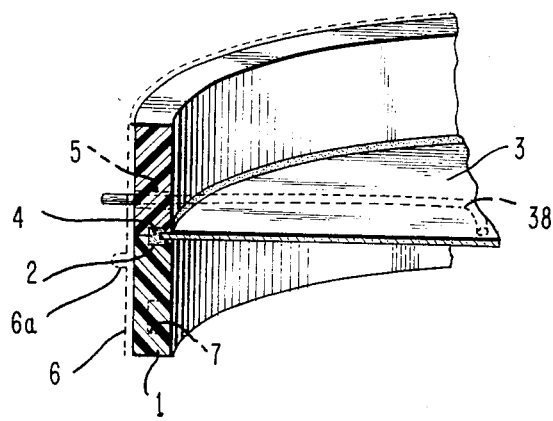
FIG. 1 is a partially sectional perspective elevational view of the principles of construction and of the spacial coordination of the construction components.

In accordance with the present invention there is provided a semiconductor element, which comprises a semiconductor disk 3 and an insulating body 1 annularly surrounding the semiconductor disk, where the insulating body is provided with a recess 2, 14, 23, 43 substantially adapted to the edge zone of the semiconductor disk 3 as well as is formed in the sections adjoining the recess for a concentric disposition of contact components on the two sides of the semiconductor disk. The semiconductor disk 3 is enclosed at its edge zone in the recess 2, 14, 23, 43 of the insulating body and is supported there. In case of a semiconductor disk with a gate electrode, the gate current conductor 38 is led through the insulating body 1 and then is provided as a spring body with a rotatable and curved end piece for pressure contacting the gate electrode.

The insulating body 1 can be provided as a centering mount which comprises at least two annular pieces 10. The insulating body 1 can comprise n annular pieces 10 where n is equal to or larger than three. The n annular pieces 10 can be connected like a chain via n−1 flexible connecting extensions 101 formed in each case on the outside of the annular pieces. The recess 2 for supporting and embedding the semiconductor disk 3 can be filled with a stabilizing and passivating material 4 and the edge zone of the semiconductor disk is immersed into the material. The stabilizing and passivating material 4 can be a member of the group consisting of silicones, silicone caoutchouc, and mixtures thereof, which material 4 performs an adhesive function relative to the material of the insulating body 1 and relative to the semiconductor disk 3. The outer surface of the insulating body 1 can comprise an annular bead 6a with a coating 6 for increasing the flash-over voltage stability.

The insulating body 1 can comprise two part rings 11, 15 in axial sequence and where the part rings are provided at their inner front faces with a profile adapted for forming a joint recess 14. The insulating body 1 can be provided in addition to the axial adjustment of the semiconductor disk 3, where each part ring 11, 15 of the insulating body 1 is provided at its inner circumferential face with a stepwise extending inner collar 12a, 15a and where the inner collar extended inner front face of each part ring 11, 15 is provided with a profile, which forms a relief for receiving a material 4, a longer arm at the outer jacket face for connecting the part rings and a shorter arm at the inner circumferential face for a clamp shaped axial support of the semiconductor disk 3. Each part ring 15 can be provided with a weakened fracture line 16 for reducing its construction length upon introduction into a disk cell casing with predetermined casing dimensions. Each part ring 11 can comprise two axially assembled part ring sections 12, 13 and only the inner part ring section 12 can be provided and dimensioned for incorporation into a disk cell case with a preset construction length. The outer part ring section 13 can be provided with a flange shaped collar 13a at its inner edge region for supporting a sealing body between the part ring 12 and a contacting disk stacked onto the semiconductor disk 3.

A band shaped centering construction part 22 with overlapping ends can be provided as an insulating body and the overlapping ends can be formed to provide a mutually rigid connection with a catch. The ends of the band shaped centering part 22 can comprise in each case an overlapping inner section 22c, 22d and an outer section 24, 26 snapping in with the inner section and the clamps provided for mutual engagement become fixed by snapping in with the aid of oppositely oriented notches 25, 27. The insulating body 1 in the area regions adjacent to the recess 2, for supporting and embedding the edge zone of the semiconductor disk 3, can be provided in each case with a groove 7 closed at the circumference for accepting a sealing body 12.

The insulating body 1 can be made of a ceramic material. The insulating body 1 can alternatively be made of a plastic material of the group of high temperature stable thermoplastics. A radial bore 5 can be provided in the insulating body 1 for feeding though a gate current lead 38. A radially running tube 44 can be disposed in the bore 5 for surrounding the lead 38.

The section of the gate current lead 38 following in the interior of the casing to the insulating body 1 can be formed arcuate like a leaf spring for furnishing a direct contacting of the gate electrode of the semiconductor disk 3, in connection thereto the end in the interior of the casing of the gate current lead 38 can be provided with a curved section shaped like a hook or an eye, and at the onset of the curvature, the end of the gate current lead is angled vertically relative to the gate current lead axis and is disposed rotatable around this axis. The curved end 38a can be formed planar at its sliding face on the gate electrode of the semiconductor disk 3 for area support during the position ready for operating 39. The curved end 38a can be formed like the arc of a circle and comprises several arc sections with different centers of curvature. The curved end 38a can comprise an extended section and an arcuate end section.

According to the construction of FIG. 1 a semiconductor disk 3 is surrounded at its circumference by an annular insulating body 1. The latter is provided at its inner circumferential surface with a recess 2 closed in itself. The depth of the recess can be from about 0.2 to 0.8 of the wall thickness of the annular body. It is substantially adapted to the shape of the edge zone of the semiconductor disk 3 and can be for example a groove. According to the invention, the edge zone runs in the region of the exit of the p-n transition at an acute angle relative to the p-n transition face and is provided with a surface protection layer not shown here. The edge zone protrudes into a filling of a passivating and stabilizing material 4 disposed in the recess 2. In addition, the insulating body 1 can be adapted for adjusting the semiconductor disk in axial direction. For this purpose, the recess 2 is for example formed with steps at its side walls to the inner circumferential face toward a smaller opening diameter, as can be recognized in FIG. 3a at the inner section of the collar 12a. The semiconductor disk 3 then is disposed at least with one face to the corresponding face section of the recess 2.

The insulating body 1 is provided with a certain construction height in order to dispose concentrically contact pieces at the semiconductor disk 3 such as circular metal contact blanks from molybdenum or pressure pieces of copper, however under consideration of the connection of the pressure pieces to connector or terminal parts such as connection rails. Furthermore, grooves for the sealed enclosure of in each case a sealing body can be provided at the inner jacket surface between the recess 2 and the respective front face in order to provide a sealed enclosure of the semiconductor disk 3, as is indicated in FIG. 1 with dashed lines.

A coating can be provided at the outer jacket face of the insulating body in order to increase the stability against voltage flash-over. The coating can be for example a stocking tube and can be furnished with for example at least one bead-like protrusion 6a. This is shown in the Fig. with dashed lines.

The semiconductor disk 3 is provided with a sequence of layered zones of different conduction types with one or more p-n transitions. In case of a semiconductor disk with four zones of alternatingly opposite conduction type for gate controlled semiconductors, the gate current lead runs (compare FIG. 6) immediately in the bore shown with interrupted lines or in a tubular feed-through running through the bore, but the feed through is not illustrated here. According to the invention, the control gate electrode is then contacted by pressure with a spring force. For this purpose the control current conductor according to FIGS. 5 and 6 and their description is formed and disposed spacially.

The passivating and stabilizing material 4 provided exhibits advantageously adhesive action versus the material of the insulating body 1 and versus the semiconductor material. Thereby, a clearly covered edge face of the semiconductor disk 2 is assured in the region of the exit of the the p-n transition or transitions in a surprisingly simple way. Materials of the group of silicones have proven to be efficient. Favorable results have been achieved with commercial types of silicone caoutchouc.

The insulating body 1 can comprise a ceramic material or a high-temperature stable thermoplastic material, which maintains its shape in case of all occurring operating temperatures and which exhibits no gassing. For example, favorable results have been achieved with the materials polysulfone, polyethersulfone, or polysulfoneether-ketone.

Figure 2:
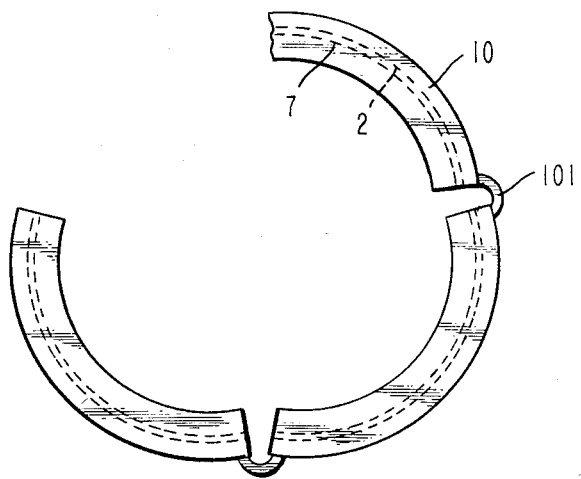
FIG. 2 is a plan view of an insulating body.

In order to insert the semiconductor disk 3 into the recess 2 of the illustrated insulating body 1 this is provided from at least two parts for axial or radial assembly. The insulating body can comprise two radial pieces 10. The subdivision into an annular ring pieces with n equal to or larger than 3 has proven to be advantageous as is illustrated in FIG. 2. Flexible extensions 101 in each case applied to the outer jacket can serve for the connection of annular pieces 10 made of plastic. In case of n annular pieces then there results with the aid of n−1 extensions a chain-like arrangement, as can be recognized from FIG. 2. The annular pieces are connected by welding or gluing for production of the insulating body 1. The recess 2 and the groove 7 are illustrated with dashed lines.

Figure 3:
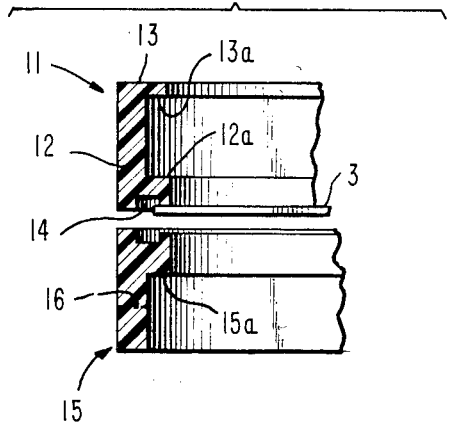
FIG. 3a is a sectional view of an insulating body.
FIG. 3b is a sectional view of an insulating body.

The FIGS. 3a and 3b show embodiments of the insulating body 1. According to an embodiment of FIG. 3a it comprises two part rings 11, which are connected axially at a section of their oppositely disposed front faces. Such a connection is not shown, however it can be recognized at the provided front face section from the spacial construction-proper opposite disposition of part rings at their symmetry plane, even in case of a different provision of the form and shape of the part rings.

Each part ring 11 is provided with a groove-like recess at its front face disposed toward the other, which limits a longer arm at the outer jacket face and a shorter arm at the step-shaped protruding extension 12a of the inner jacket face. The front face of the longer arm is a connecting face of the part rings, and the front face of the shorter arm can form the adjustment face for the semiconductor disk 3. The recess 14 formed between the two part rings 11 serves to accept the passivating and stabilizing substance material 4 and the edge zone of the semiconductor disk 3. The material 4 based on its adhesive properties versus the adjacent materials serves at the same time as a connecting means for the part rings 11.

In order to meet the needs for a universal application, each part ring can comprise two part ring sections 12 and 13 for reducing the construction height of the semiconductor device to a dimension determined by the construction into standard disk cell casings, which part ring sections are connected with the aid of a corresponding profile formation at their axial connection surfaces by assembly of a joint. The part ring section 13 is eliminated in case of an application in disk cell casings. If the part ring section 13 is employed then it can be provided at the free end of its inner jacket face with a flange like projection over hang 13a for the enclosure of a sealing body between the part ring 11 and a contact disk not illustrated and disposed in a stack with the semiconductor disk 3.

The part ring 15 of the insulating body is formed as one piece according to FIG. 3b and is provided with a weakened fracture line 16 for reducing of the construction height for the above recited application at a corresponding distance from the outer front face. The inner collar 15a for adjustment of device components corresponds substantially to the protruding extension 12a in FIG. 3a. However, its axial extension at a part stack for gate controllable semiconductor elements is limited on the gate electrode side in order to consider unavoidable eccentricities on the centering of a contact disk of molybdenum.

Figure 4:
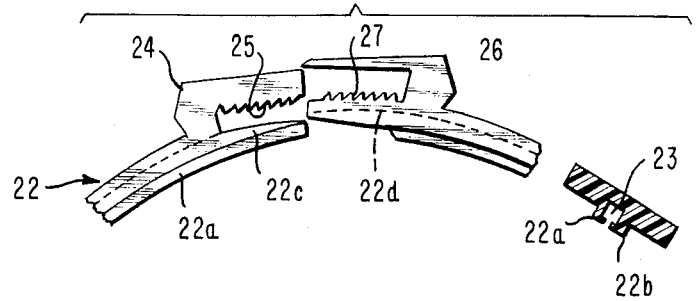
FIG. 4 is a front view and sectional view of another embodiment of the insulating body.

According to a further advantageous embodiment the insulating body is of the shape of a band like centering component 22 with ends 22c, 22d overlapping each other. The end sections are shown in FIG. 4. The profile of the insulating body provided in FIG. 4 for surrounding the edge zone of the semiconductor disk 3 and the simultaneously provided adjustment of stack parts is illustrated additionally in a cross-sectional view, in order to allow recognition of the course of profile sections upon overlapping of the ends 22c, 22d.

The mechanical stable connection of the ends is obtained by mutual fixing with snapping in. A clamping piece serves for this purpose in each case, which clamping piece is formed from one end of the centering component 22 and of a substantially L-shaped section 24, 26 formed at the outer face of the centering component 22. The two clamping pieces are arrested in a fixed state by overlapping assembly from the position shown and with the aid in each case of engaging notches 25, 27 disposed in each case at the middle of the three support surfaces. The closure lock can be released again. The in each case narrowing profile provision at the two ends 22c, 22d can be recognized from the drawing for achieving of a recess between the two extensions 22a, 22b. According to the invention the surrounding of the semiconductor disk 3 is assured thereby in case of connected ends by placing on top of each other of sections joining to a profile in each longitudinal particle.

In case of construction forms for incorporation into conventional disk cell casings with predetermined measurements, a centering component with overlapping ends can be produced for example with the aid of so-called hose clamps known from various technical branches. The hose clamp is removed after production of a solid connection of the ends.

The invention is not limited to the examples described. The ends of the centering component 22 can be furnished with extensions, which allow a simple and little protruding so-called snap-on cap closure. The kinds of closure as such are not subject matter of the invention, however only their application in case of a mechanically stable enveloping of a semiconductor disk.

Figure 5:
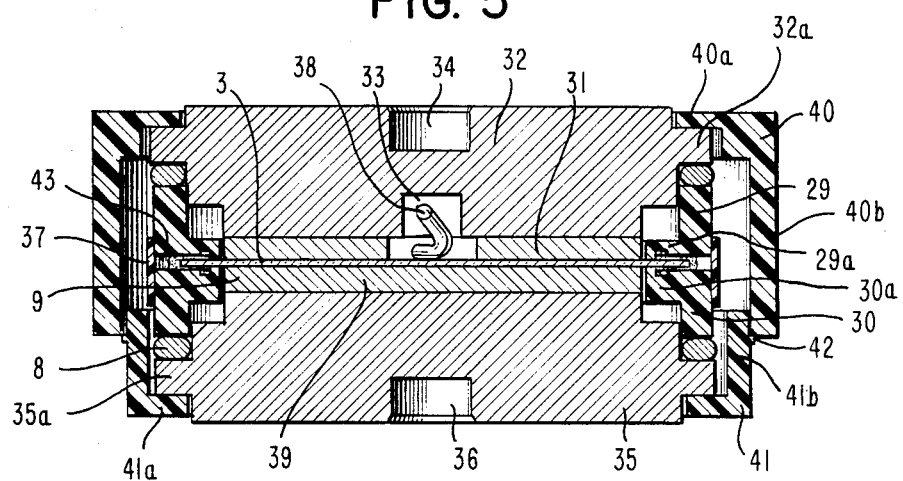
FIG. 5 is a sectional view of an embodiment illustrating the application of the invention subject matter.
Figure 6:
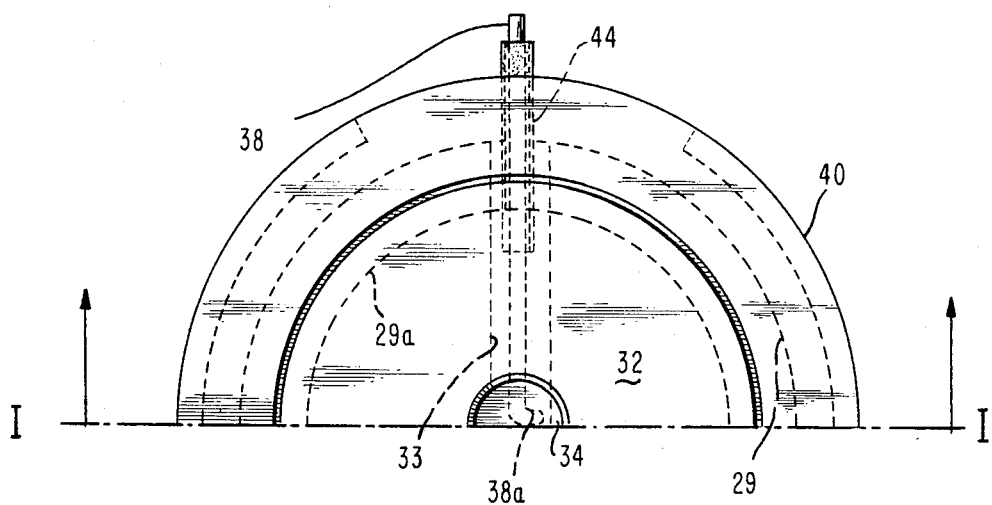
FIG. 6 is a partial plan view of the embodiment of FIG. 5 illustrating the application of the invention subject matter.

The subject matter of the invention is advantageously employed with further components in the construction of a self-contained semiconductor device as shown in FIGS. 5 and 6. The invention semiconductor element comprises the semiconductor disk 3 and the part rings 29, 30. They exhibit substantially an L-shaped profile and have an axial arm for the concentric adjustment of contact parts 32, 35 designated as pressure parts and with a radial arm 29a, 30a. The two radial arms are disposed at a distance and mirror symmetrical relative to a plane, which at the same time represents the middle plane of the semiconductor disk 3, and they form a continuous recess 43 for receiving the edge zone of the semiconductor disk 3. The recess 43 is closed with an elastic coating 37 covering the two part rings at the outer jacket face of the part rings 29, 30, for example with a shrink-down plastic tubing. The front face of the part rings 29, 30 can be provided according to that of the construction forms illustrated in the FIGS. 3a and 3b for formation of a recess 43. The pressure exerted by the part rings on the semiconductor disk for its adjustment is relatively small as compared with the contact pressure existing in the area of the pressure pieces.

Contact plates 9 and 31 of molybdenum, the latter with an opening for the control gate electrode contacting, are disposed following to the semiconductor disk 3 and they are adjusted via the part rings 29, 30. Then the pressure pieces 32, 35 of copper follow, where the first is provided with a recess 33 for the control gate feed line. The two pressure pieces are disposed concentrically to the semiconductor element via the part rings and form with the part rings a sealing case for the semiconductor element between a flange shaped extension 32a, 35a at its jacket face and the front face of the part rings in each case.

Screwed nuts or caps 40, 41 designated as tensioning elements are furnished for providing the desired support of the stacked and adjusted parts as a self-contained device. The tensioning or clamping elements have a bowl like base shape and are placed like a cap in each case on one of the pressure pieces. The basis part 40, 41a of each tensioning element similar to a base plate is provided as a ring disk, which rests in each case on the free surface of the flange shaped extension 32a, 35a. The contact faces of the pressure pieces 32, 35 are laying free thereby The wall of the tensioning elements is limited for example to three arcuate wall sections 40b, 41b of equal dimensions and of equal mutual distance. The radial extension of the tensioning elements is dimensioned for an overlapping arrangement at the free end of the wall sections, and the overlapping faces are provided with corresponding notches 42 for the mutual engagement and for fixing by snapping in. This connection can be released by rotating of the tensioning elements and for this purpose the wall sections 40b, 41b are for example disposed in each case at a distance of at most 61 degrees and are provided with an arc length corresponding to at most 59 degrees.

The pressure pieces 32, 35 are provided in each case with an adjustment bore 34, 36 at their outer contact face.

The pressure contacting provided according to the invention at a semiconductor element according to the invention with a semiconductor body with a gate electrode is also shown in the application example of FIGS. 5 and 6. A wire shaped gate current conductor 38 made of a spring material, for example of spring steel serves for contacting the centrally disposed gate zone. The first section of this gate current conductor is led via a tube piece 44 of the insulating body 29 (compare FIG. 6). The second section between tube piece and gate electrode of the semiconductor disk 3 runs in a recess 33 of the pressure piece 32 and is formed arcuate like a leaf spring for obtaining a spring force for the pressure contacting. The third section, provided for the disposition of the gate electrode and designated as a contact bow is provided at its free end with a curvature 38a formed like a hook or an eye and is at the neck of the curvature angled into a plane vertical to the control gate current conductor axis. Thus the contact bow is disposed rotatable around this axis, and the curvature represents a curve piece for the sliding motion of the bow on the semiconductor disk.

The curve piece can be provided with a circular arc shape with a length of at least a semicircle or can comprise several parts with different curvature centers or of one extended section angled for example essentially only vertically with an final bent end section.

By rotating the gate current conductor 38 as the rotation axis of the contact bow 38a the rotation axis is moved from a starting position with shortest distance to the end position with largest distance to the semiconductor disk with the aid of the curve piece against the spring force of the second section. Thereby the spring force is increased to an amount in the contemplated region of about 200 Newton, to 300 Newton.

The recess 33 of the pressure piece 32 is adapted to the groove provided in the contact plate 31 of molybdenum for the disposition of the contact bow 38a.

The contact bow 38a is formed planar 39 at the corresponding location of its ready for operating position for the desired surface like support on the semiconductor disk.

A selfcontained and independent device in a construction ready for applications is present with the illustrated enveloping.

Similarly, the invention semiconductor element can advantageously also be disposed between cooling elements, which serve simultaneously as pressure pieces and which are formed correspondingly. For example, plate shaped cooling element parts can be provided with table shaped extensions, which are placed adjacent at the stacks formed of the semiconductor disk and the adjacent contact disks of molybdenum.

It will be understood that each of the elements described above, or two or more together, may also find a useful application in other types of electronic component packaging system configurations and mounting procedures differing from the types described above.

While the invention has been illustrated and described as embodied in the context of a semiconductor device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. Semiconductor device comprising
    a semiconductor disk;
    an insulating body surrounding the semiconductor disk like a circle wherein the insulating body comprises n pieces for forming said circle, where n is equal to or larger than three and wherein the n pieces for forming said circle are connected like a chain via n−1 flexible connecting extensions formed in each case on the outside of the pieces for forming said circle;
    a recess provided at the inner jacket face of the insulating body and closed into itself and formed for engaging and mechanically fixing the edge zone of the semiconductor disk, where the semiconductor disk is at its edge zone directly supported and embedded in the recess of the insulating body and where the insulating body is formed at the ,sides. regions of the inner jacket face adjacent to the recess such as to accept a contacting element structure attached on the two sides of the semiconductor disk;
    a gate electrode disposed at the semiconductor disk;
    a lead for the gate running from the outside of the insulating body through the insulating body; and
    a rotary and curved end spring piece pressure contacting the gate electrode and connected to the lead.

2. The semiconductor device according to claim 1 wherein the insulating body provided as a centering mount comprises at least three pieces for forming said circle.

3. The semiconductor device according to claim 1 wherein the recess for supporting and embedding the semiconductor disk is filled with a stabilizing and passivating material and where the edge zone of the semiconductor disk is immersed into the material.

4. The semiconductor device according to claim 3 wherein the stabilizing and passivating material is a member of the group consisting of silicones, silicone rubber and mixtures thereof, which material performs an adhesive function versus the material of the insulating body and versus the semiconductor disk.

5. The semiconductor device according to claim 1 wherein the outer surface of the insulating body comprises an annular bead with a coating for increasing the flash-over voltage stability.

6. Semiconductor device comprising
    a semiconductor disk;
    an insulating body surrounding the semiconductor disk like a circle wherein the insulating body comprises two part rings in axial sequence and where the part rings are provided at their inner front faces with a profile having a joint recess;
    a recess provided at the inner jacket face of the insulating body and closed into itself and formed for engaging and mechanically fixing the edge zone of the semiconductor disk, where the semiconductor disk is at its edge zone directly supported and embedded in the recess of the insulating body and where the insulating body is formed at the regions of the inner jacket face adjacent to the recess such as to accept a contacting element structure attached on the two sides of the semiconductor disk;
    a gate electrode disposed at the semiconductor disk;
    a lead for the gate running from the outside of the insulating body through the insulating body; and
    a rotary and curved end spring piece pressure contacting the gate electrode and connected to the lead.

7. The semiconductor device according to claim 6 wherein the insulating body is provided in addition to the axial adjustment of the semiconductor disk, where each part ring of the insulating body is provided at its inner circumferential face with a stepwise extending inner collar and where the inner collar extended inner front face of each part ring is provided with a profile, which forms a relief for receiving a material, a longer arm at the outer jacket face for connecting the part rings and a shorter arm at the inner circumferential face for a clamp shaped axial support of the semiconductor disk.

8. The semiconductor device according to claim 6 wherein each part ring is provided with a weakened fracture line for reducing its construction length upon introduction into a disk cell casing with predetermined casing dimensions.

9. The semiconductor device according to claim 6 wherein each part ring comprises two axially assembled part ring sections and where only the inner part ring section is provided and dimensioned for incorporation into a disk cell case with a preset construction length.

10. The semiconductor device according to claim 9 wherein the outer part ring section is provided with a flange shaped collar at its inner edge region for supporting a sealing body between the part ring and a contacting disk stacked onto the semiconductor disk.

11. The semiconductor device according to claim 1 wherein a band shaped centering construction part with overlapping ends is provided as an insulating body and where the overlapping ends are formed to provide a mutually rigid connection with a catch.

12. The semiconductor device according to claim 11 where the ends of the band shaped centering part comprise in each case an overlapping inner section and an outer section snapping in with the inner section and wherein the clamps provided for mutual engagement become fixed by snapping in with the aid of oppositely oriented notches.

13. The semiconductor device according to claim 1 wherein the insulating body in the area regions adjacent to the recess for supporting and embedding the edge zone of the semiconductor disk is provided in each case with a groove closed at the circumference for accepting a sealing body.

14. The semiconductor device according to claim 1 wherein the insulating body is made of a ceramic material.

15. The semiconductor device according to claim 1 wherein the insulating body is made of a plastic material of the group of high temperature stable thermoplastics.

16. The semiconductor device according to claim 1 wherein a radial bore is provided in the insulating body for feeding through a gate current lead.

17. The semiconductor device according to claim 16 wherein a radially running tube is disposed in the bore for surrounding the lead.

18. The semiconductor device according to claim 1 wherein the section of the gate current lead following in the interior of the casing to the insulating body is formed arcuate like a leaf spring for furnishing a direct contacting of the gate electrode of the semiconductor disk, in connection thereto the end in the interior of the casing of the gate current lead is provided with a curved section shaped like a hook or an eye, and at the onset of the curvature the end of the gate current lead is angled vertically relative to the gate current lead axis and is disposed rotatable around this axis.

19. The semiconductor device according to claim 18 wherein the curved end is formed planar at its sliding face on the gate electrode of the semiconductor disk for area support during the position ready for operating.

20. The semiconductor device according to claim 18 where the curved end is formed like the arc of a circle and comprises several arc sections with different centers of curvature.

21. The semiconductor device according to claim 18 wherein the curved end comprises an extended section and an arcuate end section.

* * * * *